(12) United States Patent
Adams

(10) Patent No.: US 6,284,413 B1
(45) Date of Patent: Sep. 4, 2001

(54) METHOD OF MANUFACTURING SEMICUSTOM RETICLES USING RETICLE PRIMITIVES AND RETICLE EXCHANGER

(75) Inventor: Thomas E. Adams, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/108,848

(22) Filed: Jul. 1, 1998

(51) Int. Cl.[7] ........................................... G03F 9/00
(52) U.S. Cl. ................................................... 430/5
(58) Field of Search .................. 430/5, 312; 378/34, 378/35

(56) References Cited

U.S. PATENT DOCUMENTS

| | | | |
|---|---|---|---|
| 5,532,114 | * | 7/1996 | Bae ........................................ 430/312 |
| 5,563,012 | * | 10/1996 | Neisser .................................... 430/22 |
| 5,620,816 | * | 4/1997 | Dao ........................................... 430/5 |
| 5,631,112 | * | 5/1997 | Tsai et al. ............................... 430/22 |
| 5,633,101 | * | 5/1997 | Imai ........................................... 430/5 |
| 5,652,163 | * | 7/1997 | Schinella et al. ....................... 437/51 |
| 5,725,971 | * | 3/1998 | Moriuchi et al. ......................... 430/5 |
| 5,733,798 | * | 3/1998 | Michael et al. ...................... 437/195 |
| 5,902,705 | * | 5/1999 | Okamoto et al. ......................... 430/5 |
| 5,925,578 | * | 7/1999 | Bae ...................................... 438/736 |

* cited by examiner

*Primary Examiner*—Mark F. Huff
*Assistant Examiner*—Saleha R. Mohamedulla

(57) ABSTRACT

A system for, and method of, manufacturing a semicustom reticle for an integrated circuit (IC) and an IC manufactured by the system or the method. In one embodiment, the system includes: (1) a library of reticle primitives, at least two of the reticle primitives containing patterns corresponding to portions of a layer to be created by the semicustom Reticle and (2) exposure equipment that employs the at least two of the recticle primitives to create an image of the patterns on the semicustom reticle to allow the semicustom reticle to create the layer in a single lithographic step.

8 Claims, 4 Drawing Sheets

METHOD OF MANUFACTURING SEMICUSTOM RETICLES USING RETICLE PRIMITIVES AND RETICLE EXCHANGER

TECHNICAL FIELD OF THE INVENTION

The present invention is directed, in general, to semiconductor fabrication and, more specifically, to a system and method of manufacturing reticles using reticle primitives.

BACKGROUND OF THE INVENTION

Integrated circuits generally contain millions of individual electronic devices, each typically the size of a few micrometers, and interconnections thereamong. As a result, no "physical" tool is adequate for fabricating the complex patterns representing the devices and interconnections on a semiconductor substrate. Instead, microelectronic patterning is conventionally performed by radiation, e.g., light, x-rays or electron beams. The process of using an optical image and a photosensitive film to produce a pattern on a semiconductor substrate is known as "photolithography."

In photolithography, a film of a photoresist (photosensitive film) is first applied to the substrate. Radiation is then projected through a transparent plate, or "mask," on which has been created a desired pattern in an opaque material. The resulting image is focused on the photoresist-coated substrate, yielding areas of light and shadow on the substrate that correspond to the image on the mask plate. Following development and etching processes, where portions of the resist and substrate are removed, a pattern corresponding to that on the mask is etched in the substrate film.

During the infancy of microelectronics, the master image (pattern) was photographically reduced from a macroscopic original. The desired pattern was cut by hand into a colored plastic sheet and the image reduced to the desired size using room-sized reduction cameras. This method has been replaced by a pattern generator, an apparatus that accepts a computer-generated description of the device and analyzes it into individual picture frames. The pattern generator then scans a mask plate, "writing" the pattern on the mask plate using, for example, a high intensity electron beam, to expose each device or interconnect in the pattern.

Semiconductor devices may typically be made up of as many as fifty individual layers of silicon, polysilicon, silicon dioxide, metal and silicides. The pattern for each layer is contained on a mask called a reticle. Reticles are generally between one and ten times the actual size of the pattern they produce. The group of reticles that corresponds to all the layers of an integrated circuit (IC) is called a reticle set.

The pattern generation process, requiring point-to-point creation of a complex pattern on a semiconductor wafer, is generally a slow process. Usually only one of the multiple device images to be printed on a semiconductor substrate is pattern-generated. The single device pattern, or reticle, is then replicated repeatedly using a step-and-repeat camera (commonly known as a stepper) to form the array of devices and interconnects that cover the semiconductor substrate. The reticle may also consist of an array of several patterns and is distinguished from a mask that contains patterns that can be transferred to an entire semiconductor wafer (or to another mask) in one exposure.

Not only is the production of a reticle a slow process, it is also an expensive process. For example, it may take up to several hours for a conventional electron-beam exposure apparatus to produce a reticle with a circuit pattern of a degree of integration equivalent to that of a 256 MDRAM integrated circuit. As mentioned-above a reticle set corresponding to a semiconductor device that has up to fifty reticles is not uncommon. Therefore, with the current electron-beam exposure apparatus production rate limited to only be a few reticles a day, the production of the semiconductor device may be significantly delayed.

Accordingly, what is needed in the art is an improved method to manufacture a reticle that overcomes the above-described limitations.

SUMMARY OF THE INVENTION

To address the above-discussed deficiencies of the prior art, the present invention provides a system for, and method of, manufacturing a semicustom reticle for an integrated circuit (IC) and an IC manufactured by the system or the method. In one embodiment, the system includes: (1) a library of reticle primitives, at least two of the reticle primitives containing patterns corresponding to portions of a layer to be created by the semicustom reticle and (2) exposure equipment that employs the reticle primitives to create an image of the patterns on the semicustom reticle to allow the semicustom reticle to create the layer in a single lithographic step (or multiple steps, if such is desired).

The present invention therefore introduces the broad concept of generating a semicustom reticle by photographing portions of selected reticle primitives thereon. For purposes of the present invention, "reticle primitive" is defined as a reticle that contains one layer of a given circuit module. "Circuit module" is, in turn, defined as a piece of circuitry that can be employed as a building block to construct a larger circuit. For instance, a semicustom reticle may be employed to create an IC suitable for telecommunications. The IC may include such circuit modules as digital-to-analog (D/A) and analog-to-digital (A/D) converter circuitry, filters, a processor and associated memory banks. Reticle primitives corresponding to layers of each of these circuit modules may be photographed onto a semicustom reticle and interconnected in separate steps (and the steps performed in either order).

In one embodiment of the present invention, the portions correspond to a layer of selected ones of: (1) static random access memory (SRAM) modules, (2) electrically eraseable programmable read-only memory (EEPROM) modules, (3) field-programmable gate array (FPGA) modules, (4) programmable logic array (PLA) modules, (5) D/A converter modules, (6) A/D converter modules, (7) digital signal processor (DSP) modules, (8) microprocessor modules, (9) microcontroller modules, (10) linear amplifier modules, (11) filter modules and (12) charge coupled devices (CCD). Those skilled in the art will recognize, however, that many circuits can be constructed of such well-known circuit modules. The present invention extends to all conventional and later-discovered circuit modules.

In one embodiment of the present invention, the exposure equipment subjects each of the reticle primitives to multiple exposures. Thus, the reticle primitives may be projected onto different locations on a given semicustom reticle to create the necessary image to create a layer of a plurality of ICs on a wafer in a single lithographic step.

In one embodiment of the present invention, the exposure equipment comprises a reticle exchanger that allows the reticle primitives to be sequentially exchanged. This allows automatic substitution of reticle primitives without requiring human intervention. Of course, the present invention is not restricted to automatic substitution.

In one embodiment of the present invention, the semicustom reticle includes a transparent substrate and a pattern defined by an opaque material and formed on the transparent substrate, the pattern transferred on the transparent substrate from at least two reticle primitives containing patterns corresponding to a device level of an IC.

In one embodiment of the present invention, the transparent substrate is composed of quartz. Alternately, in other embodiments, the transparent substrate may be composed of soda-lime glass or borosilicate glass.

In one embodiment of the present invention, the opaque material is chrome. Alternately, in other embodiments, the opaque material may be iron oxide, aluminum, gold, tungsten or emulsion.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
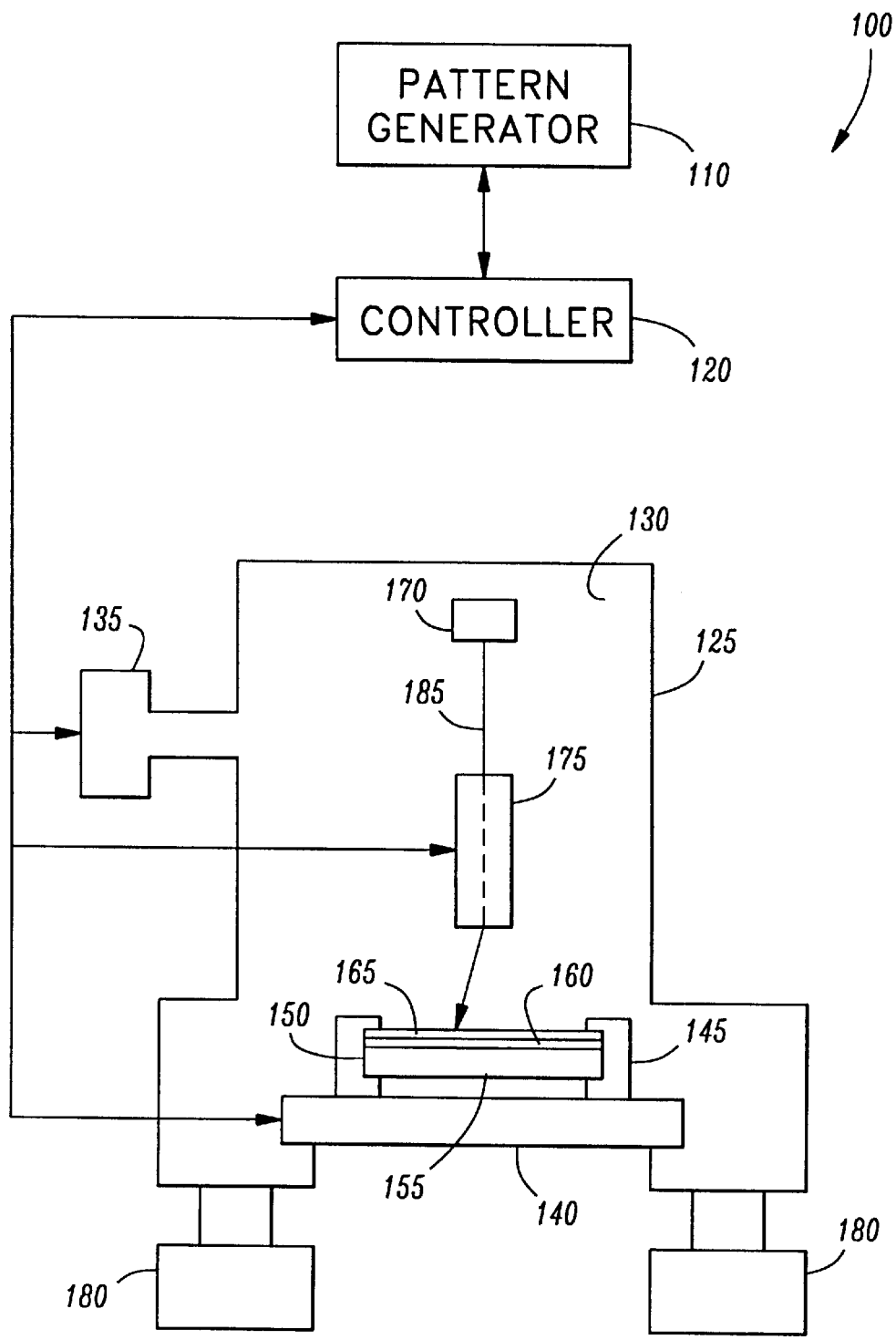
FIG. 1 illustrates a conventional electron-beam (e-beam) exposure system that is typically employed in the manufacture of a reticle.

Referring initially to FIG. 1, illustrated is a conventional electron-beam (e-beam) exposure system 100 that is typically employed in the manufacture of a reticle. Although a typical e-beam exposure system is discussed herein, those skilled in the art are aware of other conventional approaches, such as laser-based systems, that are also employed conventionally in producing a reticle. The e-beam exposure system 100 includes a pattern generator 110, such as a design tape or graphic computer-aided-design (CAD) data, of circuit patterns that is converted to a "machine" language. The circuit pattern description is provided to a controller 120 that controls the operation of an e-beam apparatus 125. The e-beam apparatus 125 includes a vacuum chamber 130 that is mounted on a plurality of vibration dampers (generally designated 180). The vacuum chamber 130 is controlled by a vacuum system 135, such as a vacuum pump, that reduces and maintains the pressure within the vacuum chamber 130.

Also shown in the illustrated embodiment, within the vacuum chamber 130, is an X-Y table 140 that is movable in both the X and Y directions, typically with the use of servo motors (not shown). A mask holder 145 for securing a mask blank 150 is fixed on top of the X-Y table 140. As shown in the illustrated embodiment, the mask blank 150 comprises a glass substrate 155 on which a chromium layer 160 is applied. Another layer of an electron beam resist 165 material overlies the chromium layer 160.

The mask blank 150 is set on the X-Y table 140 and secured in the mask holder 145 with the chromium layer 160 and the resist 165 positioned above the glass substrate 155. An electron beam 185 radiated from an electron gun 170 is optimized by an electronic optical system 175 and focused on the resist 165. Concurrently with the radiation of the electron beam 185, data corresponding to the circuit pattern to be formed on the mask blank 155 is transformed by means of the pattern generator 110 to a format that is suitable for image formation. Based on the suitably transformed format, the controller 120 controls the electronic optical system 175 and the X-Y table 140 to thereby image-form the desired pattern on the resist 165. Following the image formation, the resist 165 is developed and the chromium layer 160 is etched using the residual resist 165 as a mask. Subsequently, the residual resist 165 is removed leaving the desired chromium circuit pattern remaining on the glass substrate 155.

As discussed previously, it may take up to several hours for the e-beam system 100 to produce a reticle with a circuit pattern of a degree of integration equivalent to that of a 256 MDRAM integrated circuit. An alternate method to manufacture an integrated circuit (IC) using existing reticles instead of creating new reticles is disclosed in U.S. patent application Ser. No. 09/082,924 entitled "System and Method of Manufacturing Semicustom Integrated Circuits Using Reticle Primitives and Interconnect Reticles" filed on May 21, 1998, which is commonly owned by the assignee of the present invention and incorporated herein by reference in its entirety. In the above patent application, reticle primitives of existing and often-used circuit modules are used to produce a semicustom IC that contains the circuit modules eliminating the need to create new reticles.

By way of illustration, the above patent application discloses a method that utilizes two or more reticle primitives to form each level, i.e., layer, within an IC. For example, the entire gate level of an IC having a SRAM, a DSP and other-circuitry (each with a respective reticle primitive set) may be formed by consecutively employing the SRAM gate level reticle primitive, the DSP gate level reticle primitive and then the other-circuitry gate level reticle primitive. In other words, the gates of the entire IC are defined by three reticle primitives (instead of one reticle as in conventional chip fabrication). Similarly, window openings in the IC are defined by the utilization of three reticles, i.e., SRAM, DSP and other-circuitry, instead of one reticle.

The present invention utilizes the previously mentioned reticle primitives to define a single semicustom reticle for each device level within an IC to create a semicustom reticle set. Furthermore, as opposed to conventional e-beam techniques, the present invention discloses a novel optical method of fabricating the semicustom reticle that substantially reduces the time required to produce the semicustom reticle.

Figure 2:
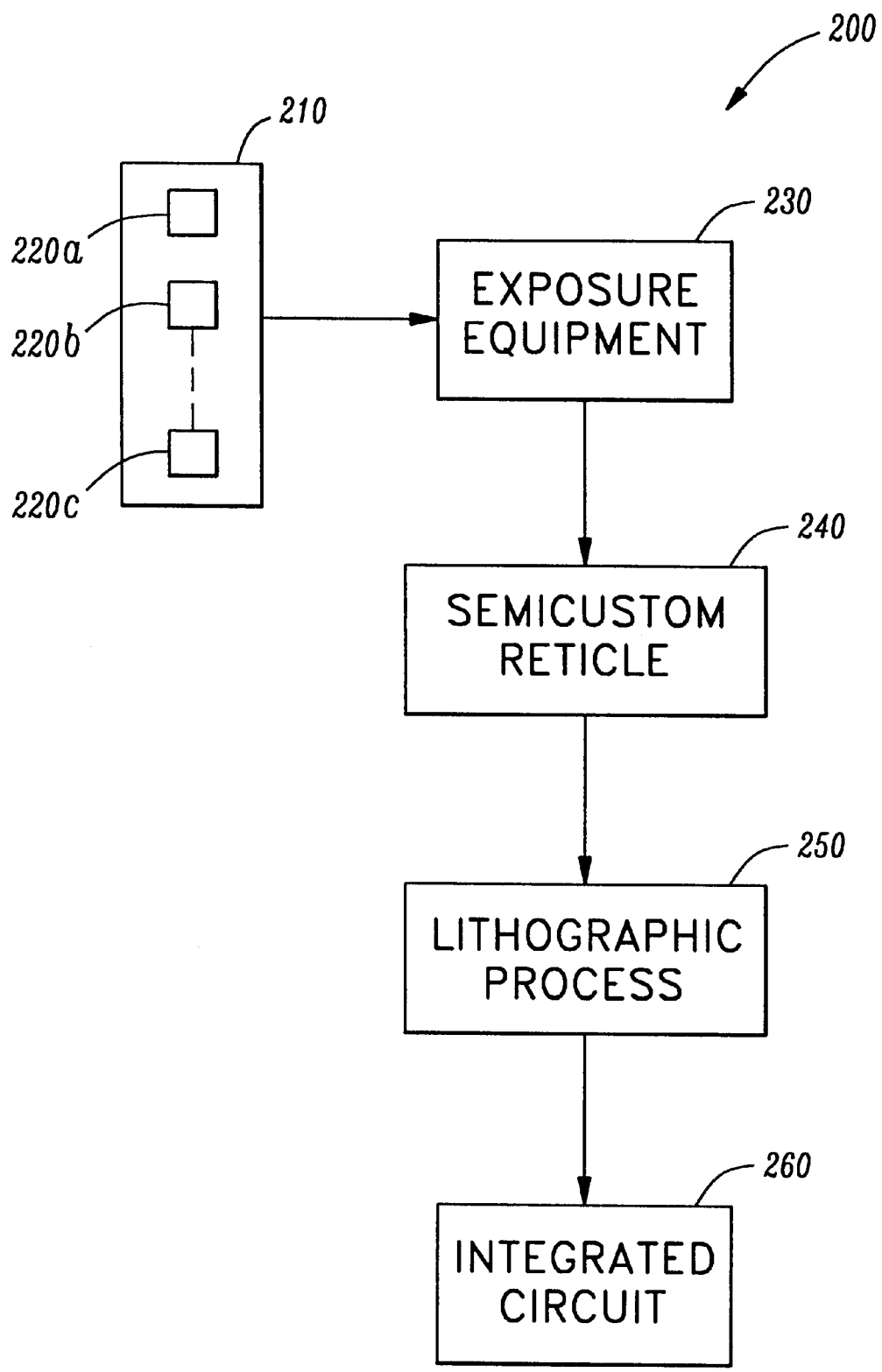
FIG. 2 illustrates an embodiment of a system for manufacturing a semicustom reticle for use in producing an integrated circuit according to the principles of the present invention.

Turning now to FIG. 2, illustrated is an embodiment of a system 200 for manufacturing a semicustom reticle 240 for use in producing an integrated circuit 260 according to the principles of the present invention. In the illustrated embodiment, a library 210 is shown containing a plurality of reticle primitives (first, second and third reticle primitives 220a, 220b, 220c are shown) of standard functional circuit modules such as static random access memories (SRAMs). Those skilled in the art should readily appreciate that the library 210 may also contain, in advantageous embodiments, reticle primitives of standard electrically eraseable programmable read-only memory (EEPROM) modules, field-programmable gate array (FPGA) modules, programmable logic array (PLA) modules, digital-to-analog (D/A) converter modules, analog-to-digital (A/D) converter modules, digital signal processor (DSP) modules, microprocessor modules, microcontroller modules, linear amplifier modules, filter modules and charge coupled devices (CCD).

The library 210 is also shown coupled to a exposure equipment 230, such as a conventional step-and-repeat camera (stepper), that employs at least two of the plurality of reticle primitives, e.g., first and second reticle primitives 220a, 220b, in a lithographic process to create a semicustom reticle 240. In another advantageous embodiment, the exposure equipment 230 includes a reticle exchanger that allows the plurality of reticle primitives to be sequentially exchanged. It should be noted that a reticle primitive may be employed more than once within the same integrated circuit. The present invention does not contemplate limiting its use to any particular sequence. The exposure of the reticle primitives serially (sequentially) or in parallel are within the broad scope of the present invention. The semicustom reticle 240, in turn, is employed in a conventional lithographic process 250 to produce an integrated circuit (IC) 260. The creation of the semicustom reticle 240 may be explained in greater detail by referring to FIGS. 3A through 3G, with continuing reference to FIG. 2.

Figure 3A:
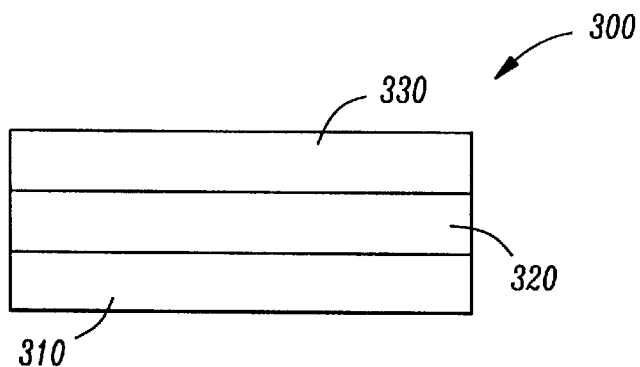
FIG. 3A illustrates an exemplary cross-sectional view of a semicustom reticle undergoing an initial preparation step of the semicustom reticle manufacturing process.
Figure 3B:
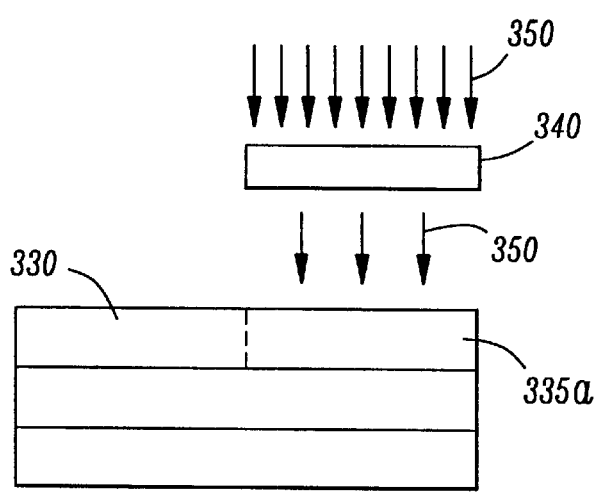
FIG. 3B illustrates an exemplary cross-sectional view of the semicustom reticle wherein a pattern is formed in a first portion of the photoresist using a first reticle primitive.

Turning now to FIGS. 3A through 3G, illustrated are various exemplary steps of an embodiment of a semicustom reticle manufacturing process 300 according to the principles of the present invention. Beginning with FIG. 3A, illustrated is an exemplary cross-sectional view of a semicustom reticle undergoing an initial preparation step of the semicustom reticle manufacturing process 300. An opaque material 320, e.g., chrome, is deposited onto a transparent substrate 310 using conventional deposition methods such as sputtering or evaporation. In another advantageous embodiment, the opaque material 320 may be iron oxide, aluminum, gold, tungsten or emulsion. The transparent substrate 310, in a preferred embodiment, is composed of quartz. In other advantageous embodiments, the transparent substrate 310 may be composed of soda-lime glass or borosilicate glass. Following the deposition of the opaque material 320 over the transparent substrate 310, a layer of photoresist 330 is generally applied as a thin film onto the opaque material 320 using conventional processes. The photoresist 330 is then subjected to a pattern imaging or exposure process, as illustrated in FIG. 3B.

Turning now to FIG. 3B, illustrated is an exemplary cross-sectional view of the semicustom reticle wherein a pattern is formed in a first portion 335a of the photoresist 330 using a first reticle primitive 340. Within an exposure tool (exposure equipment of FIG. 2), such as a step-and-repeat camera or stepper (not shown), radiation (generally designated 350) is generated and shone through the first reticle primitive 340 that has been selected from the library 210. The first reticle primitive 340, which is analogous to the first reticle primitive 220a, contains a pattern that corresponds to a device level, e.g., gate layer, of the IC 260. The resulting image is focused onto the first portion 335a of the photoresist 330 reproducing the first reticle 340 pattern onto the first portion 335a. It should be noted that only the first portion 335a of the photoresist 330 has been "exposed," the remaining photoresist 330 material has not been altered photochemically by the above-described exposure process.

Figure 3C:
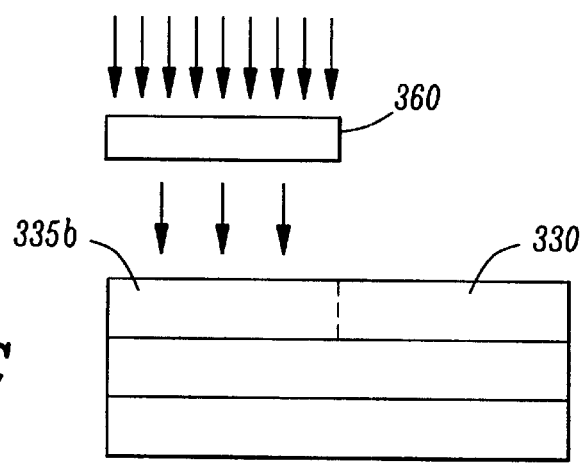
FIG. 3C illustrates an exemplary cross-sectional view of a semicustom reticle wherein a pattern is formed in a second portion of the photoresist using a second reticle primitive.

Turning now to FIG. 3C, illustrated is an exemplary cross-sectional view of a semicustom reticle wherein a pattern is formed in a second portion 335b of the photoresist 330 using a second reticle primitive 360. Similar to the exposure process illustrated in FIG. 3B above, the second reticle primitive 360 is selected from the library 210, e.g., the second reticle primitive 220b, and also contains a pattern that corresponds to the same device level of the IC 260 as was the case with the first reticle primitive 340. However, it should be noted that the patterns contained in the first and second reticle primitives 340, 360 are not similar, but instead define a particular device level of different circuit modules, e.g., SRAM and DSP circuit modules, that are components of the IC 260.

The second portion 335b of the photoresist 330 is exposed using conventional methods and the pattern contained in the second reticle primitive 360 is transferred onto the second portion 335b of the photoresist 330. Although in the illustrated embodiment, a sequence of exposing the first reticle primitive 340 followed by exposing the second reticle primitive 360 is used, it should be noted that, in other advantageous embodiments, multiple reticle primitives may be exposed at a time or a reticle primitive may be subjected to multiple exposures. The present invention does not contemplate limiting the exposure of a reticle primitive to a particular number or sequence. After the second portion 335b has been exposed, the resulting pattern on the photoresist 330 will generally define a particular device level of the IC 260. Although, in the present illustration, the first and second reticle primitives 340, 360 are shown defining a complete semicustom reticle, the number of reticle primitives employed to define a semicustom reticle will invariably vary depending on the number of circuit modules that make up the IC 260. Thus, the practice of the present invention is not contemplated to be limited to the use of any particular fixed number of reticle primitives to form the pattern on the semicustom reticle.

It should be noted that the terms transparent substrate and opaque material should be interpreted in terms of the exposure process or tool being employed in the reticle manufacturing process 300. It should be apparent to those skilled in the art that, e.g., opaque, in the context of "phase-shift" reticles, also includes the thickness of the material on a transparent substrate. Similarly, the transparent substrate employed also depends on the exposure process or tool employed and may, also in addition to the above, include a thin membrane. Although in the above discussion, transparent and opaque are defined conventionally, those skilled in the art should readily appreciate that transparent and opaque relates to the "exposure energy" which may be electrons, X-rays or other forms of energy.

Figure 3D:
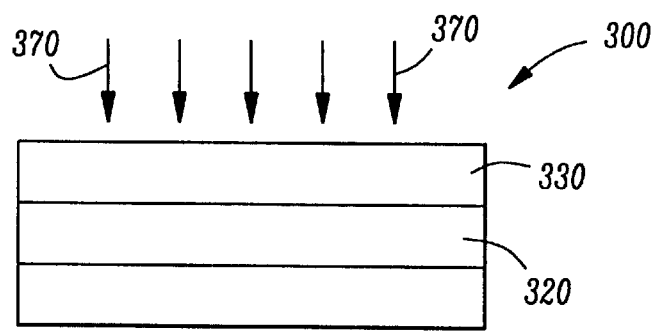
FIG. 3D illustrates an exemplary cross-sectional view of the semicustom reticle wherein the photoresist is subjected to development.

Turning now to FIG. 3D, illustrated is an exemplary cross-sectional view of the semicustom reticle wherein the photoresist 330 is subjected to development. Following the exposures of the first and second portions 335a, 335b, the photoresist 330 is typically washed with an organic solvent (generally designated 370), in the case of negative resist, using conventional methods such as immersion, spray or puddle developing. During the development process, the photoresist 330 is washed away in the areas corresponding to the transferred patterns from the first and second reticle primitives 340, 360 resulting in the illustration of FIG. 3E.

Figure 3E:
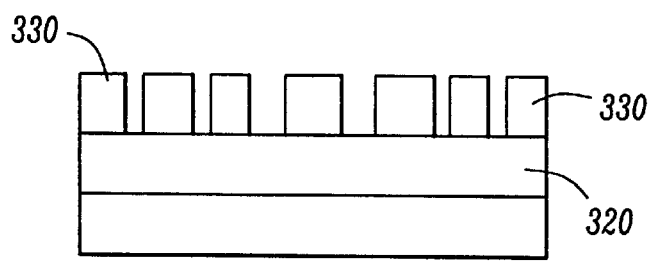
FIG. 3E illustrates an exemplary cross-sectional view of the semicustom reticle after development of the photoresist.

Turning now to FIG. 3E, illustrated is an exemplary cross-sectional view of the semicustom reticle after development of the photoresist 330. The remaining photoresist 330 defines a pattern over the opaque material 320 that is identical to the combined pattern of the first and second reticle primitives 340, 360.

Figure 3F:
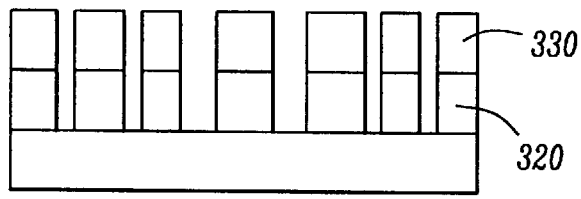
FIG. 3F illustrates an exemplary cross-sectional view of the semicustom reticle after an etching process.
Figure 3G:
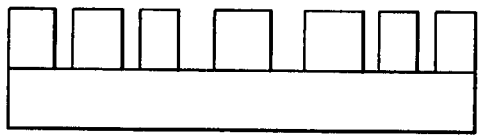
FIG. 3G illustrates an exemplary cross-sectional view of the completed semicustom reticle.

Turning now to FIG. 3F, illustrated is an exemplary cross-sectional view of the semicustom reticle after an etching process. Following the development of the photoresist 330, the regions of the opaque material 320 no longer covered by the photoresist 330 are removed in a conventional etching process, thereby replicating the first and second reticle primitives 340, 360 patterns in the opaque material 320. The remaining photoresist 330 is then removed resulting in the completed semicustom reticle, which is analogous to the semicustom reticle 240, illustrated in FIG. 3G.

Although the above exemplary semicustom reticle manufacturing process 300 has been described in the specific context of a single semicustom reticle corresponding to a particular device level in the IC 260, those skilled in the art should appreciate that the above-described semicustom reticle manufacturing process 300 may also be used, in a preferred embodiment, to create a reticle set corresponding to all the device levels, e.g., isolation, gate, windows and interconnect layers, of the IC 260. In other words, for each device level of the IC 260, one semicustom reticle is used for definition on a silicon substrate. However, the semicustom reticle for each device level is defined by utilization of two or more reticle primitives corresponding to the different circuit modules that make up the IC 260. Since the semicustom reticle for each device level, in a preferred embodiment, is defined optically, the semicustom reticle may be created in a much shorter period of time than with current e-beam definition techniques.

Although the present invention has been described in detail, those skilled in the art should understand that they can make various changes, substitutions and alterations herein without departing from the spirit and scope of the invention in its broadest form.

What is claimed is:

1. A method of manufacturing a semicustom reticle for an integrated circuit (IC), comprising:
    selecting, from a library of reticle primitives, at least two of said reticle primitives containing patterns corresponding to portions of a layer to be created by said semicustom reticle;
    employing exposure equipment having a recticle exchanger to said at least two of said reticle primitives to create an image of said patterns on said semicustom reticle, said reticle exchanger automatically exchanging said at least two of said reticle primitives; and
    employing said semicustom reticle to create an image of said patterns on said IC and thereby begin to form a layer of said IC.

2. The method as recited in claim 1 wherein said portions correspond to a layer of selected ones of:
    static random access memory (SRAM) modules,
    electrically eraseable programmable read-only memory (EEPROM) modules,
    field-programmable gate array (FPGA) modules,
    programmable logic array (PLA) modules,
    digital-to-analog (D/A) converter modules,
    analog-to-digital (A/D) converter modules,
    digital signal processor (DSP) modules,
    microprocessor modules,
    microcontroller modules,
    linear amplifier modules,
    filter modules, and
    charge coupled devices (CCD).

3. The method as recited in claim 1 further comprising repeating said employing to create multiple of said portions on said semicustom reticle.

4. A method of manufacturing a semicustom reticle, comprising:
    (a) coating a transparent substrate with an opaque material;
    (b) depositing a photoresist layer over said opaque material;
    (c) exposing a first portion of said photoresist layer, using exposure equipment having a recticle exchanger, to transfer a first pattern from a first reticle primitive, said first pattern corresponding to a device level of an integrated circuit (IC);
    (d) repeating (c) to transfer a second pattern from a second reticle primitive onto a second portion of said photoresist layer, said second pattern corresponding to said device level of said IC, said reticle exchanger automatically exchanging said first and second reticle primitives;
    (e) developing said photoresist layer to remove exposed portions of said photoresist layer;
    (f) etching said first and second pattern into said opaque material; and
    (g) removing remaining portions of said photoresist material, said semicustom reticle employable to create an image of said first and second patterns on said IC and thereby begin to form said device level of said IC.

5. The method as recited in claim 4 wherein said transparent substrate is selected from the group consisting of:
    quartz,
    soda-lime glass, and
    borosilicate glass.

6. The method as recited in claim 4 wherein said opaque material is selected from the group consisting of:
    chrome,
    aluminum,
    gold,
    tungsten,
    emulsion, and
    iron oxide.

7. The method as recited in claim 4 wherein said first and second reticle primitives contain gate layer patterns of said IC.

8. The method as recited in claim 4 wherein said first and second reticle primitives contain interconnect layer patterns of said IC.

* * * * *